US009147970B2

(12) United States Patent
Hsu

(10) Patent No.: US 9,147,970 B2
(45) Date of Patent: Sep. 29, 2015

(54) ELECTRICAL CONNECTOR WITH REMOVAL MECHANISM

(71) Applicant: HON HAI PRECISION INDUSTRY CO., LTD., New Taipei (TW)

(72) Inventor: Shuo-Hsiu Hsu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 129 days.

(21) Appl. No.: 13/949,148

(22) Filed: Jul. 23, 2013

(65) Prior Publication Data

US 2014/0024237 A1 Jan. 23, 2014

(30) Foreign Application Priority Data

Jul. 23, 2012 (TW) ............................ 101214158 A

(51) Int. Cl.

| | |
|---|---|
| ***H01R 12/00*** | (2006.01) |
| ***H05K 1/00*** | (2006.01) |
| ***H01R 13/633*** | (2006.01) |
| ***H01R 12/79*** | (2011.01) |

(52) U.S. Cl.

CPC ............ *H01R 13/6335* (2013.01); *H01R 12/79* (2013.01)

(58) Field of Classification Search

CPC ....... H05K 3/365; H05K 1/118; H05K 3/326; H01R 13/62938; H01R 13/633

USPC .................................... 439/267, 160, 77, 372

See application file for complete search history.

(56) References Cited

U.S. PATENT DOCUMENTS

| | | | | |
|---|---|---|---|---|
| 4,178,051 | A * | 12/1979 | Kocher et al. | 439/157 |
| 4,345,809 | A * | 8/1982 | Sugden | 439/160 |
| 6,099,330 | A | 8/2000 | Gundermann et al. | |
| 6,913,474 | B2 * | 7/2005 | Mikhail et al. | 439/157 |
| 6,926,538 | B2 * | 8/2005 | Ma | 439/74 |
| 7,014,487 | B2 * | 3/2006 | Ishikawa | 439/267 |
| 7,465,175 | B2 * | 12/2008 | Crippa et al. | 439/157 |
| 8,758,064 | B2 * | 6/2014 | Nagase et al. | 439/676 |
| 2004/0224545 | A1 * | 11/2004 | Oguchi | 439/160 |
| 2014/0141628 | A1 * | 5/2014 | Hsu | 439/67 |
| 2014/0148021 | A1 * | 5/2014 | Hsu | 439/67 |
| 2014/0304985 | A1 * | 10/2014 | Nagase et al. | 29/747 |
| 2014/0342596 | A1 * | 11/2014 | Mathews et al. | 439/470 |
| 2014/0357100 | A1 * | 12/2014 | Hsu | 439/66 |

* cited by examiner

*Primary Examiner* — Hae Moon Hyeon

(74) *Attorney, Agent, or Firm* — Wei Te Chung; Ming Chieh Chang

(57) ABSTRACT

An electrical connector for electrically connecting an electronic component with a printed circuit board (PCB) includes a socket having a plurality of lower contacts received therein, a cover assembled on the socket having a number upper contacts connecting with the lower contacts and a lever between the socket and the cover, the electronic component is soldered on the cover and connecting the upper contacts, and wherein the lever includes an operation portion, a pushing point and a fulcrum portion therebetween, when force is applied upon the operation portion, the pushing point moves around the fulcrum portion and towards the direction opposite to the force so as to remove the cover and the electronic component.

19 Claims, 13 Drawing Sheets

ELECTRICAL CONNECTOR WITH REMOVAL MECHANISM

BACKGROUND OF THE INVENTION

1. Field of the Invention

The present disclosure relates to an electrical connector, and particularly to an low insertion force (LIF) connector with removal mechanism.

2. Description of Related Art

A low insertion force (LIF) connector typically comprises a socket and a cover. The socket is soldered on a printed circuit board (PCB) while the cover is soldered with an electronic component, such as a flexible flat cable (FFC) or a flexible printed circuit (FPC). The cover together with the electronic component is assembled in the socket so as to establish an electrical connection between the PCB and the electronic component. When removal, the user has to move the cover and the electronic component manually by catching the cover and the electronic component with fingers and then pull them out. However, with the miniaturized tendency of the electrical connector, the LIF connector has a higher number of contacts and a smaller size of socket, so it is very difficult to pull the cover and the electronic component out manually. More serious, the electronic component and the cover or the contacts may be destroyed.

In view of the above, an improved electrical connector is desired to overcome the problems mentioned above.

SUMMARY OF THE INVENTION

Accordingly, an object of the present disclosure is to provide an electrical connector with a removal mechanism for removing an electronic component easily and quickly.

According to one aspect of the present disclosure, an electrical connector is provided for electrically connecting an electronic component with a printed circuit board (PCB). The electrical connector comprises a socket having a plurality of lower contacts received therein, a cover assembled on the socket having a plurality of upper contacts connecting with the lower contacts and a lever between the socket and the cover, the electronic component is soldered on the cover and connecting the upper contacts, wherein the lever comprises an operation portion, a pushing point and a fulcrum portion therebetween, when force is applied upon the operation portion, the pushing point moves around the fulcrum portion and towards the direction opposite to the force so as to remove the cover and the electronic component.

Other objects, advantages and novel features of the disclosure will become more apparent from the following detailed description when taken in conjunction with the accompanying drawings, in which:

DETAILED DESCRIPTION OF THE INVENTION

Reference will now be made to the figures to describe the preferred embodiments of the present disclosure in detail.

Figure 1:
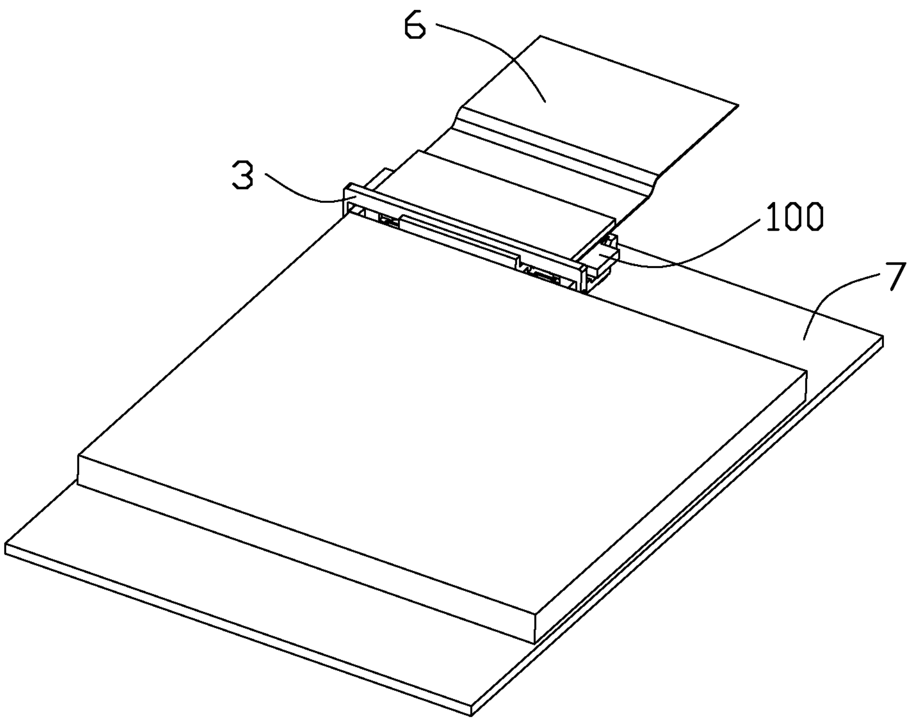
FIG. 1 is an assembled, perspective view of an electrical connector and a printed circuit board in accordance with a first embodiment of the present disclosure.
Figure 2:
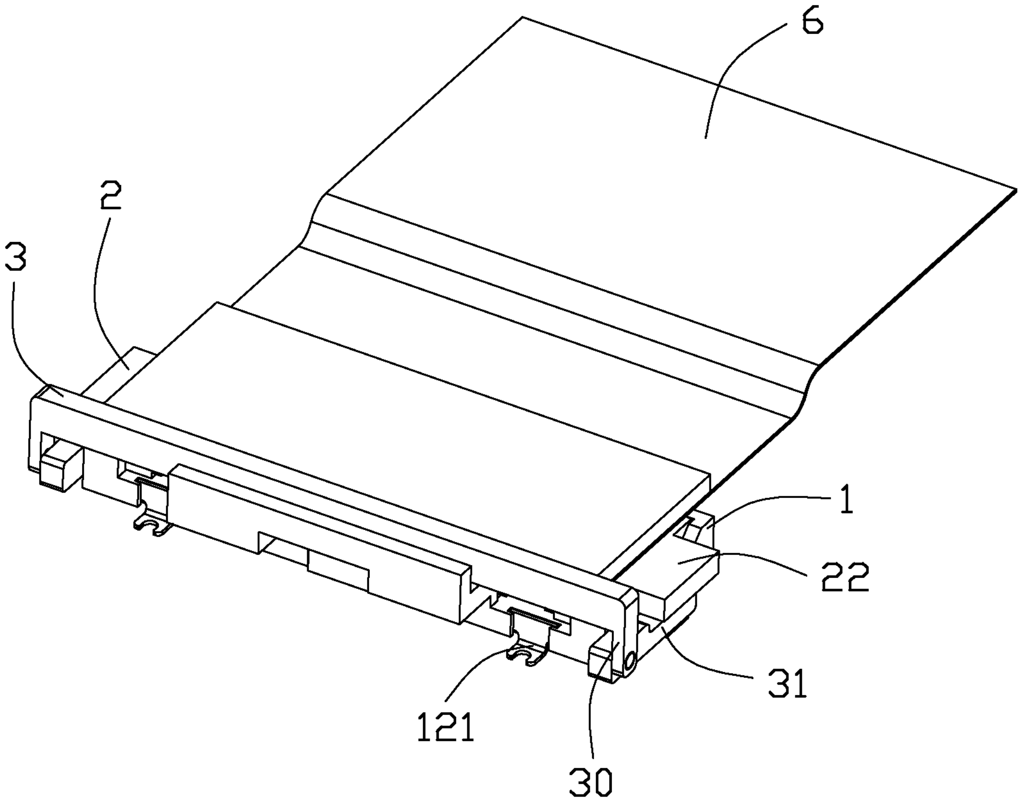
FIG. 2 is an assembled, perspective view of the electrical connector shown in FIG. 1.

Referring to FIG. 1 and FIG. 2, an electrical connector 100 in accordance with a first embodiment of the present disclosure, comprises a socket 1, a cover 2 and a lever 3 between the socket 1 and the cover 2. The electrical connector 100 is used to connect an electronic component 6, such as a flexible flat cable (FFC) or a flexible printed circuit (FPC), to a printed circuit board (PCB) 7.

Figure 3:
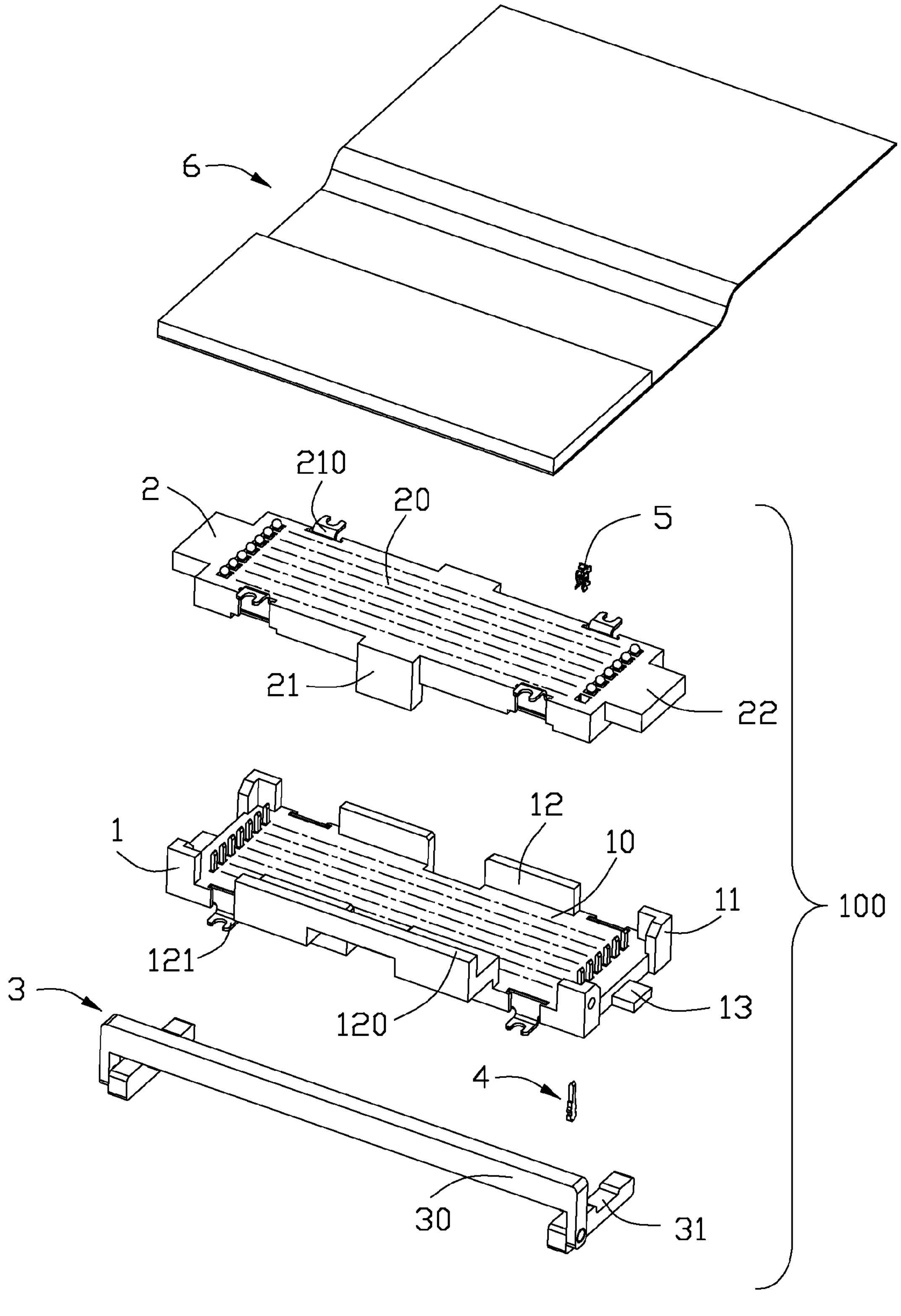
FIG. 3 is an exploded, perspective view of the electrical connector shown in FIG. 2.
Figure 4:
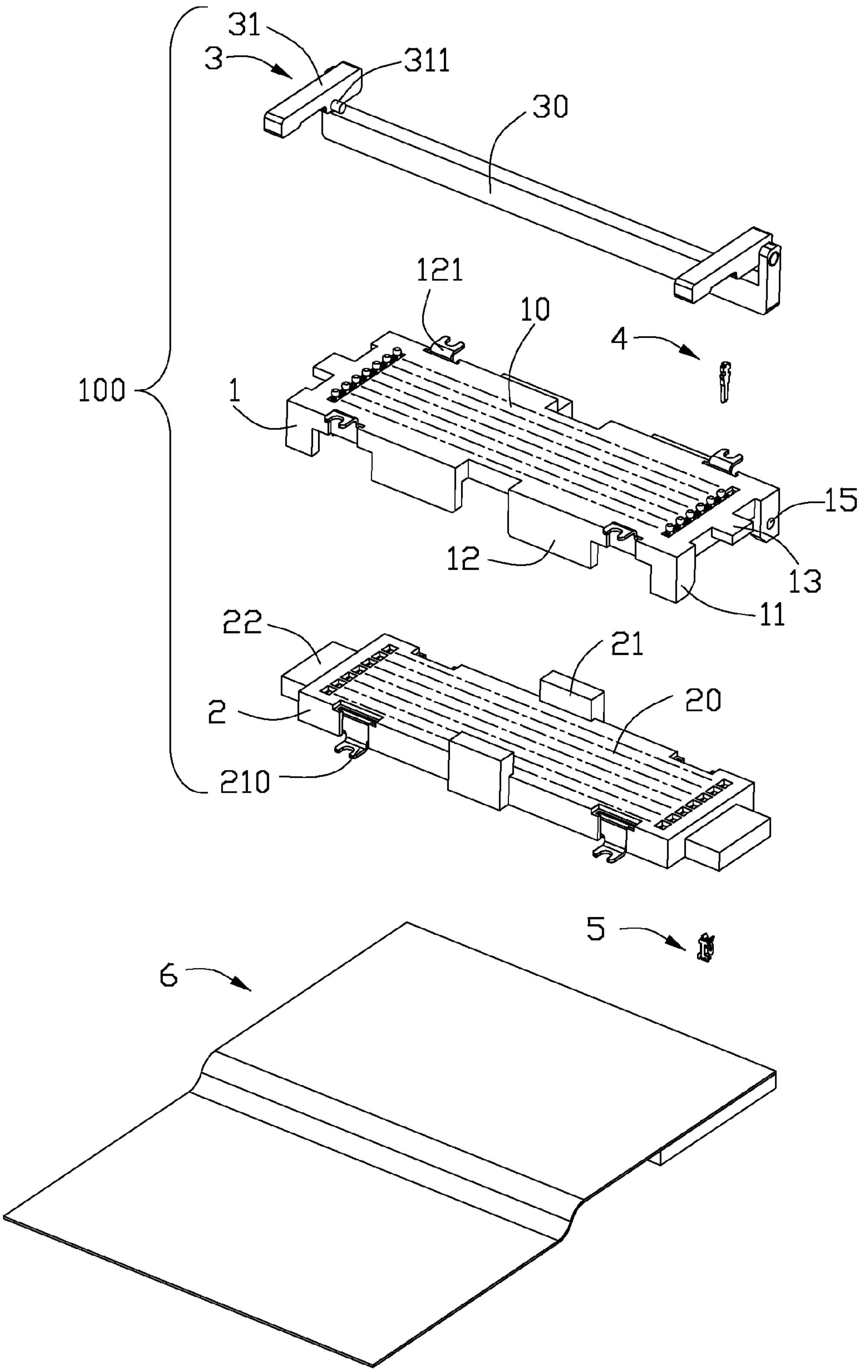
FIG. 4 is another view of the FIG. 3.

Referring to FIGS. 3 and 4, the socket 1 comprises a base portion 10 extending in a lengthwise direction, a plurality of position walls 11 extending upwardly from the corners of the base portion 10 and a plurality of side walls 12 extending upwardly along long sides of the base 10 in the lengthwise direction. One of the side walls 12 defines a receiving portion 120 by extending away from the base portion 10 horizontally and then extending upwardly. The receiving portion 120 is used to receive the lever 3. The socket 1 further comprises a pair of supporting portions 13 extending horizontally from transverse sides perpendicular to the long sides. The socket 1 comprises a plurality of lower contacts 4 retained in the base portion 10 and a plurality of metal ears 121 for soldering on the PCB 7. The lower contact 4 is pin contact having a solder ball thereon for soldering on the PCB 7.

The cover 2 is assembled on the socket 1. The cover 2 comprises a body portion 20 extending in the lengthwise direction, a pair of retaining portions 21 extending downwardly from two long sides of the body portion 20 for assembling on the socket 1. The cover 2 further comprises a pair of protrusions 22 extending horizontally from two ends in a transverse direction. The cover 2 comprises a plurality of upper contacts 5 retained in the body portion 20 and a plurality of metal ears 210 for soldering with the electronic component 6. The upper contact 5 comprises spring arm for clamping the lower contact 4. Each upper contact 5 comprises a solder ball for soldering with the electronic component 6.

The lever 3 comprises an operation portion 30 and a pushing portion 31. The pushing portion 31 comprises a first end pivotally connecting an end of the operation portion 30 and a second end opposite to the first end. There is a pivotal portion 311 formed between the first end and the second end. The socket 1 comprises a pivotal hole 15 pivotally receiving the pivotal portion 311. The pivotal portion 311 serves as a fulcrum portion when the operation portion 30 urging the first end of the pushing portion 31. The operation portion 30 locates on the receiving portion 120 while the pushing portion 31 locates upon the supporting portion 13 and under the protrusion 22 in a sandwiched manner.

Figure 5:
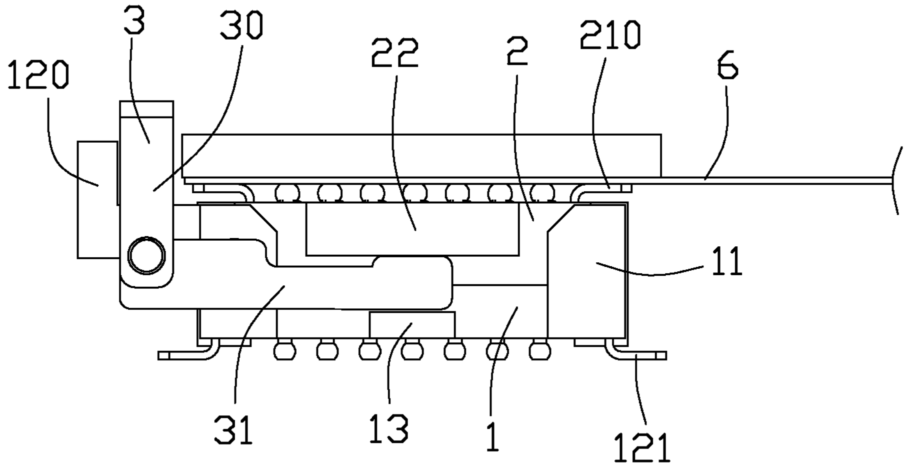
FIG. 5 is a right side view of the electrical connector shown in FIG. 2, wherein a cover together with an electronic component is assembled on a socket.
Figure 6:
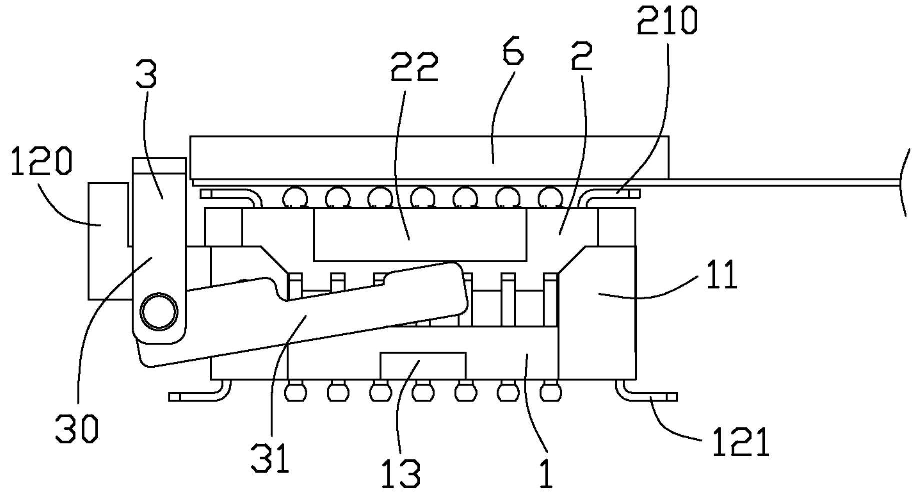
FIG. 6 is a view similar to FIG. 5, and shows the cover together with the electronic component breaking away from the socket.
Figure 7:
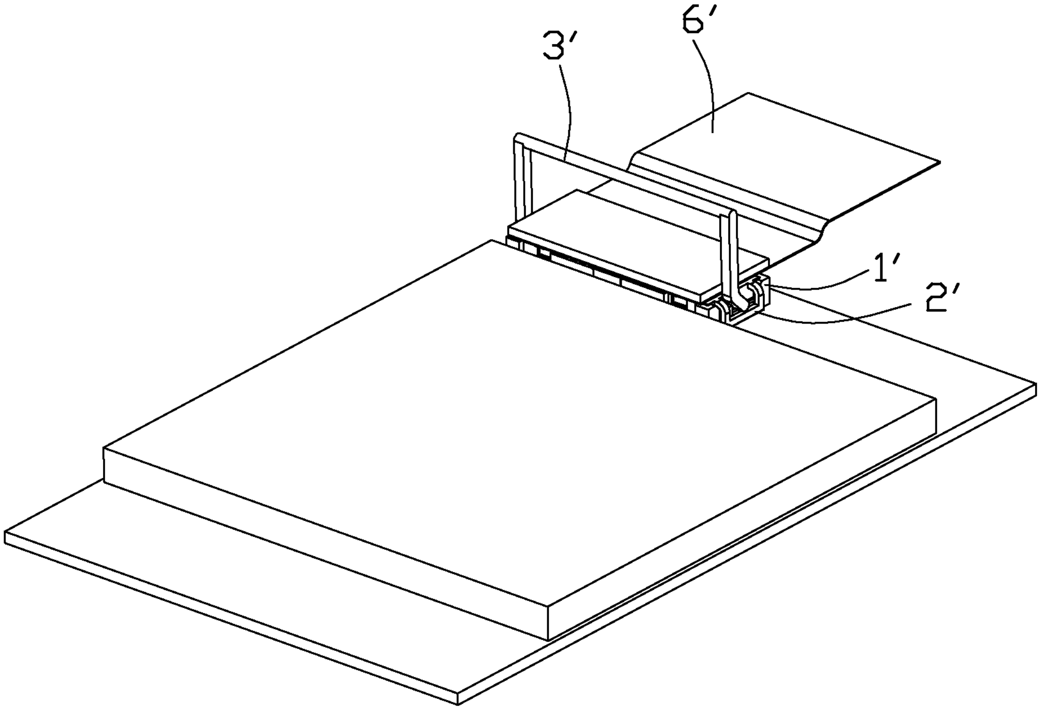
FIG. 7 is an assembled, perspective view of an electrical connector and a printed circuit board in accordance with a second embodiment of the present disclosure.
Figure 8:
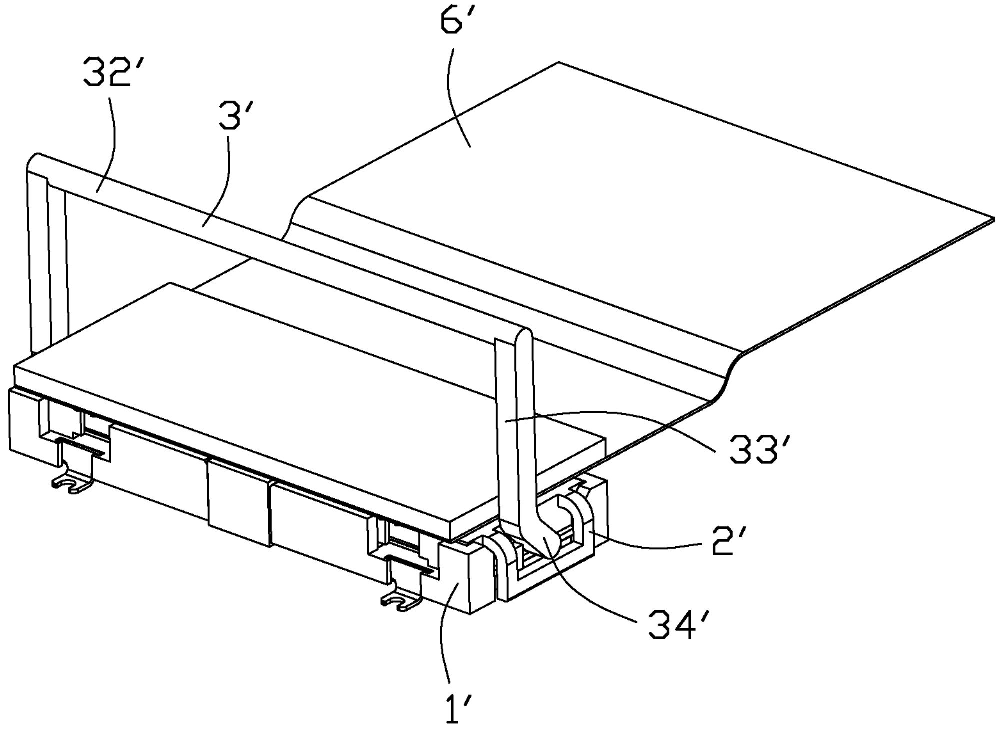
FIG. 8 is an assembled, perspective view of the electrical connector shown in FIG. 7.
Figure 9:
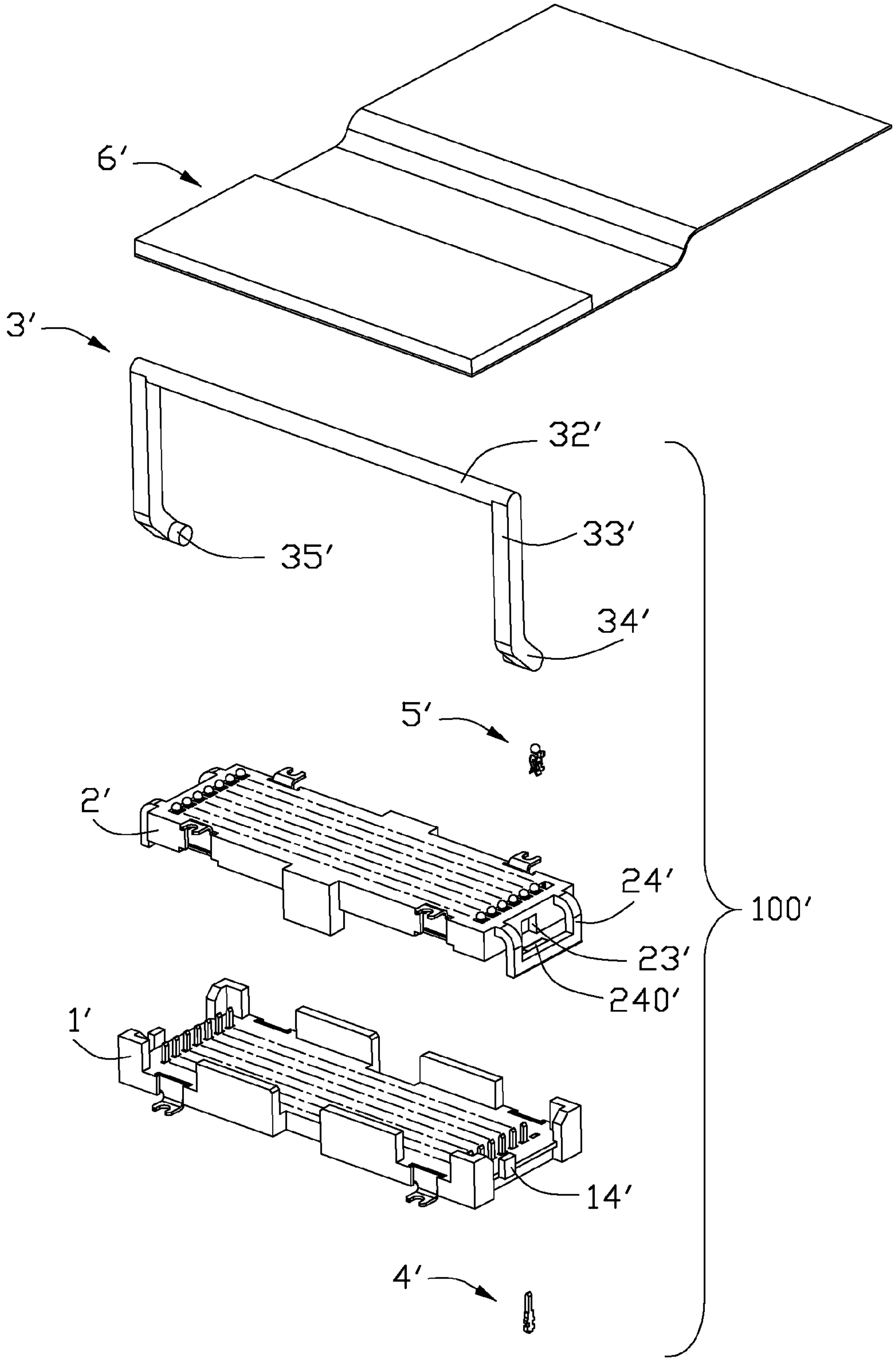
FIG. 9 is an exploded, perspective view of the electrical connector shown in FIG. 8.
Figure 10:
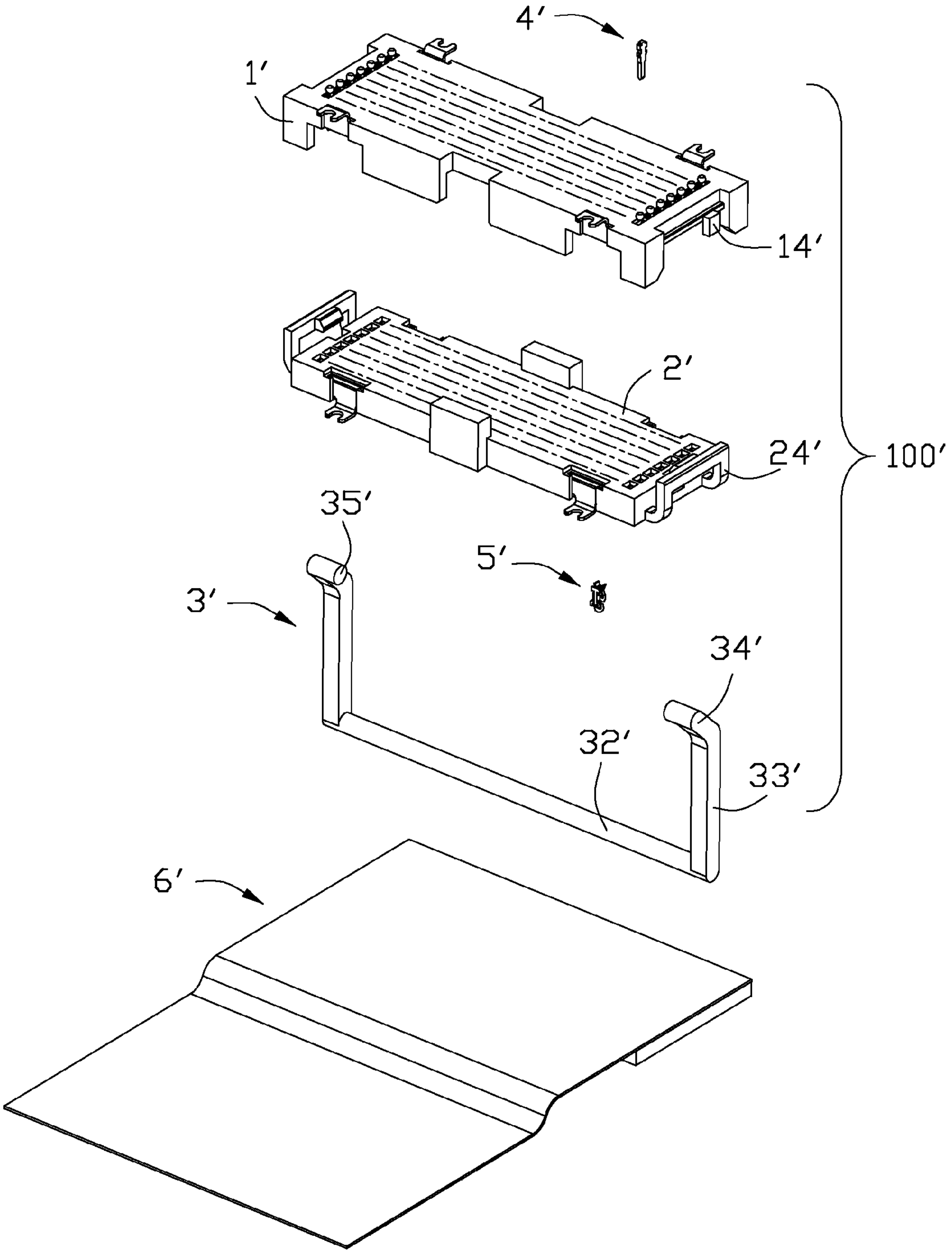
FIG. 10 is another view of FIG. 9.

Referring to FIGS. 5 and 6, when removal of the cover 2 together with the electronic component 6, a user presses the operation portion 30, and the operation portion 30 moves downwardly to press the first end of the pushing portion 31 moving downwardly. Due to the fulcrum portion, i.e. the pivotal portion 311, is formed between the first and second ends, when the first end moves downwardly, the second end moves upwardly to push the protrusion 22 up so as to remove the cover 2 and the electronic component 6 from the socket 1. The electrical connector 100 in accordance with a first embodiment of the present disclosure comprises a removal mechanism, i.e. the lever 3 to remove the cover 2 and the electronic component 6, the removal is easy and quick.

FIG. 7 to FIG. 13 show a second embodiment of the present disclosure similar to the first embodiment, wherein the electrical connector 100' comprises a socket 1', a cover 2' and a lever 3'. A plurality of lower contacts 4' retained in the socket 1' while a plurality of upper contacts 5' retained in the cover 2'. The socket 1' comprises a pair of blocks 14' extending upwardly in transverse sides of the socket 1'. The cover 2' comprises a pair of recesses 23' and a pair of latches 24' in the transverse sides of the cover 2'. Each of the latches 24' comprises a clamper 240' for engaging the socket 1'. The lever 3' comprises an operation portion 32' extending in a lengthwise direction, a pair of pushing portions extending from two ends of the operation portion 32' and perpendicular to the operation portion 32'. The pushing portion comprises a straight section 33' and a tilt section 34'. The straight section 33' and the tilt section 34' define an obtuse angle. The tilt section 34' comprises a column 35' on the inner side. The column 35' connects with the recess 23' rotatably so as to retain the lever 3' on the cover 2'.

Figure 11:
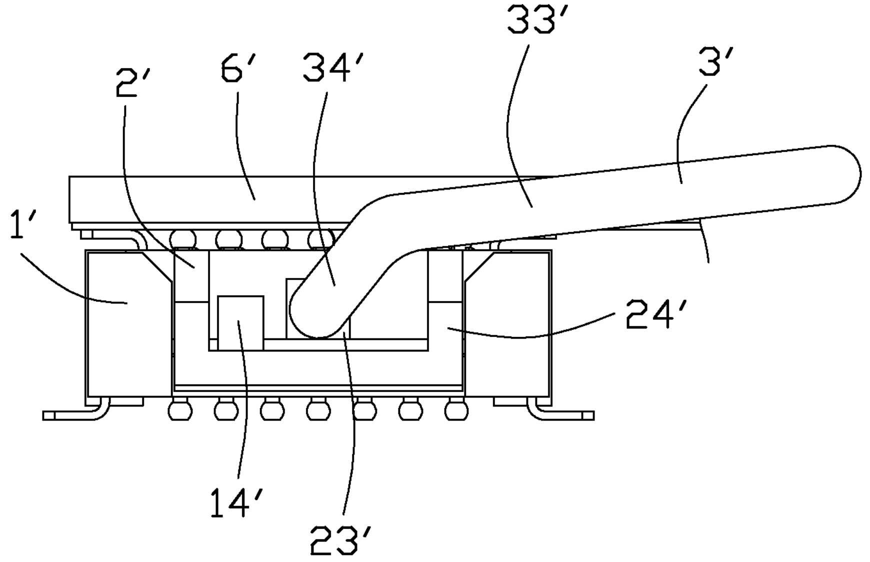
FIG. 11 is a right side view of the electrical connector shown in FIG. 8, wherein a lever is in a level state.
Figure 12:
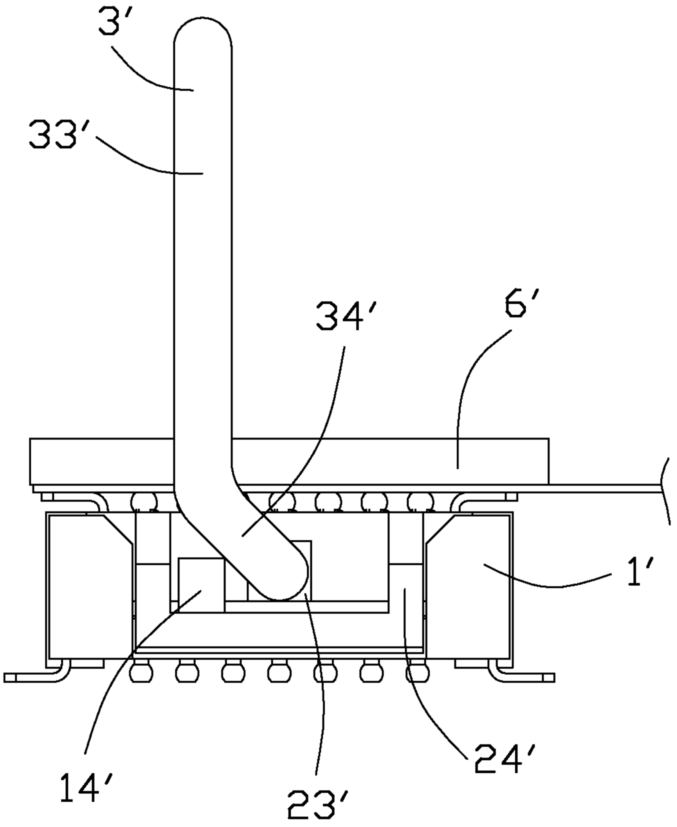
FIG. 12 is a view similar to FIG. 11, and shows the lever in a vertical state.
Figure 13:
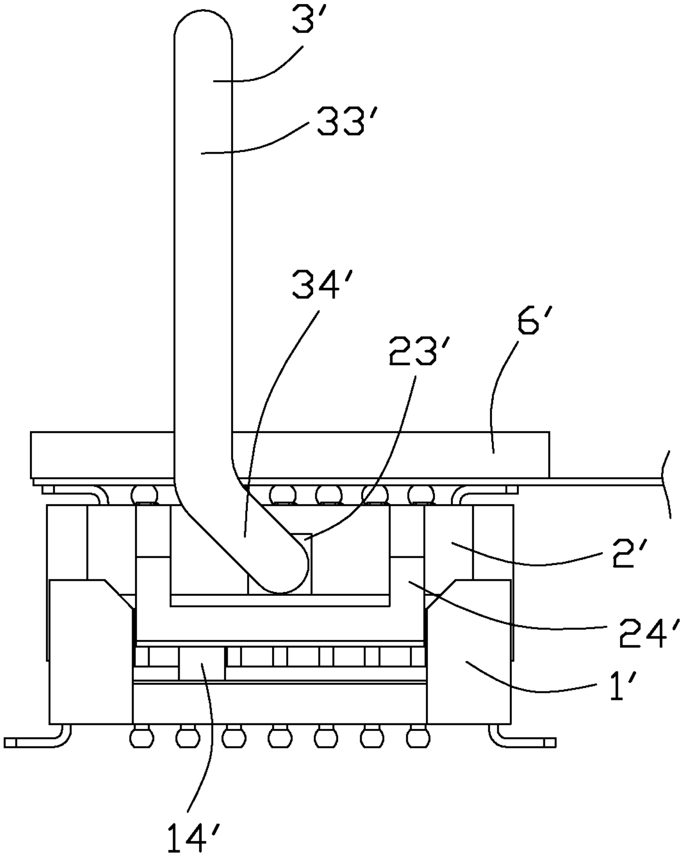
FIG. 13 is a view similar to FIG. 12, and shows a cover together with an electronic component breaking away from the socket.

Referring to FIG. 11 to FIG. 13, when removal of the cover 2' and the electronic component 6', a user rotates the lever 3' from a level position to a vertical position until the tilt section 34' contacts the block 14' defining a contacting point. And then further rotates the lever 3' in the same direction, the contacting point of the tilt portion 34' and the block 14' serves as a fulcrum portion, the column 35' moves forwardly around the fulcrum portion so as to push the cover 2' and the electronic component 6' out. And then the user may pull the lever 3' to remove the cover 2' and the electronic component 6' from the socket 1'.

Anyhow, both embodiments of the present disclosure use the leverage principle to remove the cover and the electronic component, which makes the removal easy and quick compared with the removal of the cover and the electronic component manually.

While preferred embodiment in accordance with the present disclosure has been shown and described, equivalent modifications and changes known to persons skilled in the art according to the spirit of the present disclosure are considered within the scope of the present disclosure as defined in the appended claims.

What is claimed is:

1. An electrical connector for connecting an electronic component with a printed circuit board comprising:

a socket having a plurality of lower contacts retained therein;

a cover assembled on the socket and having a plurality of upper contacts connecting with the lower contacts; and a lever comprising an operation portion and a pushing portion connecting with the operation portion, the pushing portion defining a first end connecting with the operation portion, a second end opposite to the first end for pushing the cover and a fulcrum portion formed between the first end and the second end; wherein when the operation portion urges the first end of the pushing portion, the fulcrum portion supports on the socket and the second end moves upwardly to push the cover off from the socket, wherein the fulcrum portion is a pivotal portion, and the socket comprises a pivotal hole for receiving the pivotal portion; wherein the socket comprises a supporting portion, the cover comprises a protrusion, and the pushing portion of the lever is located upon the supporting portion and under the protrusion in a sandwiched manner.

2. The electrical connector as claimed in claim 1, wherein the socket comprises a receiving portion, the operation portion of the lever locates on an inner side of the receiving portion.

3. The electrical connector as claimed in claim 2, wherein the operation portion locates in a vertical plane while the pushing portion locates in a horizontal plane.

4. The electrical connector as claimed in claim 1, wherein the lower contact is pin, the upper contact comprises spring arm clamping the pin.

5. The electrical connector as claimed in claim 4, wherein the socket comprises a plurality of solder balls connecting the lower contacts for soldering the socket on the printed circuit board.

6. The electrical connector as claimed in claim 5, wherein the cover comprises a plurality of solder balls connecting the upper contacts for soldering the cover with the electronic component.

7. The electrical connector as claimed in claim 1, wherein the cover comprises a pair of retaining portions extending downwardly from two opposite sides of the cover.

8. An electrical connector for connecting an electronic component with a printed circuit board comprising:

a socket having a plurality of lower contacts retained therein;

a cover assembled on the socket and having a plurality of upper contacts connecting with the lower contacts; and a lever comprising an operation portion and a pushing portion connecting with the operation portion, the pushing portion defining a first end connecting with the operation portion, a second end opposite to the first end for pushing the cover and a fulcrum portion formed between the first end and the second end; wherein when the operation portion urges the first end of the pushing portion, the fulcrum portion supports on the socket and the second end moves upwardly to push the cover off from the socket; wherein the pushing portion comprises a column at the second end pivotally connecting the cover, and the socket comprises a block extending upwardly from one side thereof, and wherein the lever is capable of rotating around the column until the pushing portion contacts the block forming the fulcrum portion, and then the lever further rotates around the fulcrum portion and the column moves upwardly to push the cover off from the socket.

9. The electrical connector as claimed in claim 8, wherein the cover comprises a recess on one side of the cover, the column of the lever received in the recess.

10. The electrical connector as claimed in claim 8, wherein the pushing portion comprises a straight section connecting the operation portion and a tilt section connecting the cover.

11. The electrical connector as claimed in claim 10, wherein the tilt section and the straight section define an obtuse angle.

12. The electrical connector as claimed in claim 8, wherein the lever locates in a level position before operated by a user.

13. The electrical connector as claimed in claim 8, wherein the lever locates in a vertical position when the lever contacts the block.

14. An electrical connector assembly comprising:

a first connector having a plurality of first contacts, and a second connector located above the first connector and having a plurality of second contacts, wherein the first contacts and the second contacts are adapted to be coupled to each other in a vertical direction while the first connector is configured to be mounted to a first printed circuit board and the second connector is configured to be mounted to a second printed circuit board; and a lever defining a first section pivotally mounted to one of said first connector and said second connector; and a second section positioned and configured to abut against the other of said first connector and said second connector; wherein by rotation of said lever and through cooperation of said first section and said second section of lever, said lever activates the second connector to be disengaged from the first connector upwardly, wherein each of said first connector and said second connector defines a pair of opposite long sides and a pair of opposite short sides, and a pivotal axis of said lever extends along a longitudinal direction parallel to said long sides.

15. The electrical connector assembly as claimed in claim 14, wherein the first printed circuit board is hard while the second printed circuit board is flexible.

16. The electrical connector assembly as claimed in claim 14, wherein the first section of the lever is pivotally mounted upon the first connector, and the second section of the lever is located around a free end of said lever and confronting a downward region of the second connector.

17. The electrical connector assembly as claimed in claim 16, wherein the lever includes an operation portion extending along said longitudinal direction, and a pair of pushing portions pivotally assembled at two opposite ends of the operation portion.

18. The electrical connector assembly as claimed in claim 14, wherein said first section of the lever is pivotally mounted upon the second connector, and the second section of the lever is located between a free end of the lever and the first section of the lever and confronting an upward region of the first connector.

19. The electrical connector assembly as claimed in claim 18, wherein the lever includes an operation portion extending along said longitudinal direction, and a pair of pushing portions integrally formed at two opposite ends of the operation portion.

* * * * *